(12) United States Patent
Dayton et al.

(10) Patent No.: US 10,923,646 B2
(45) Date of Patent: Feb. 16, 2021

(54) SUPERCONDUCTING SWITCH HAVING A PERSISTENT AND A NON-PERSISTENT STATE

(71) Applicant: Microsoft Technology Licensing, LLC, Redmond, WA (US)

(72) Inventors: Ian M. Dayton, Glen Burnie, MD (US); Eric C. Gingrich, Elkridge, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 5 days.

(21) Appl. No.: 16/205,363

(22) Filed: Nov. 30, 2018

(65) Prior Publication Data

US 2020/0176662 A1 Jun. 4, 2020

(51) Int. Cl.
*H01L 39/22* (2006.01)
*G11C 11/16* (2006.01)
(Continued)

(52) U.S. Cl.
CPC ........ *H01L 39/223* (2013.01); *G11C 11/1657* (2013.01); *H01F 10/3286* (2013.01);
(Continued)

(58) Field of Classification Search
CPC ..... H01L 39/223; H01L 27/222; H01L 39/12; H01L 43/02; H01L 43/10; H01L 39/025; H01F 10/3286; G11C 11/1657
See application file for complete search history.

(56) References Cited

U.S. PATENT DOCUMENTS

| | | | |
|---|---|---|---|
| 6,459,097 | B1 | 10/2002 | Zagoskin |
| 8,200,304 | B2 | 6/2012 | Maeda et al. |

(Continued)

FOREIGN PATENT DOCUMENTS

| | | |
|---|---|---|
| WO | 2013180946 A1 | 12/2013 |
| WO | 2017091258 A3 | 6/2017 |
| WO | 2018009240 A2 | 1/2018 |

OTHER PUBLICATIONS

"International Search Report and Written Opinion Issued in PCT Application No. PCT/US19/062713", dated Mar. 9, 2020, 10 Pages.

*Primary Examiner* — Patricia D Reddington
(74) *Attorney, Agent, or Firm* — Ranjeev Singh; Singh Law, PLLC

(57) ABSTRACT

Superconducting switch having a persistent and a non-persistent state and its use as a driver in a memory system are described. An example superconducting switch includes a first superconducting layer and a second superconducting layer. The superconducting switch includes a first magnetic layer having a fixed magnetization state. The superconducting switch includes a second magnetic layer capable of being at least in a first or a second magnetization state. The superconducting switch is capable of being in a first state or a second state, and the superconducting switch is configured such that an application of a magnetic field to the second magnetic layer changes a magnetization of the second magnetic layer from the first magnetization state to the second magnetization state placing the superconducting switch in the second state and a removal of the magnetic field automatically returns the superconducting switch from the second state to the first state.

20 Claims, 6 Drawing Sheets

(51) Int. Cl.
  *H01F 10/32* (2006.01)
  *H01L 27/22* (2006.01)
  *H01L 39/02* (2006.01)
  *H01L 39/12* (2006.01)
  *H01L 43/02* (2006.01)
  *H01L 43/10* (2006.01)

(52) U.S. Cl.
  CPC .......... *H01L 27/222* (2013.01); *H01L 39/025* (2013.01); *H01L 39/12* (2013.01); *H01L 43/02* (2013.01); *H01L 43/10* (2013.01); *G11C 11/16* (2013.01); *G11C 11/1673* (2013.01)

(56) References Cited

U.S. PATENT DOCUMENTS

| | | |
|---|---|---|
| 8,830,735 B2 | 9/2014 | Kariyada et al. |
| 8,971,977 B2 | 3/2015 | Mukhanov et al. |
| 9,747,968 B2 | 8/2017 | Ohki et al. |
| 2015/0043273 A1* | 2/2015 | Naaman ................. G11C 11/44 365/162 |
| 2015/0333254 A1 | 11/2015 | Liu et al. |
| 2017/0098682 A1* | 4/2017 | Ladizinsky ............ B82Y 10/00 |
| 2018/0025775 A1 | 1/2018 | Ambrose |
| 2020/0044656 A1* | 2/2020 | Herr ....................... G06N 10/00 |

\* cited by examiner

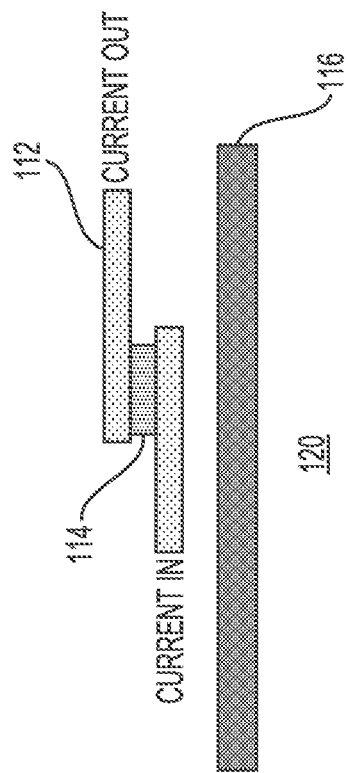
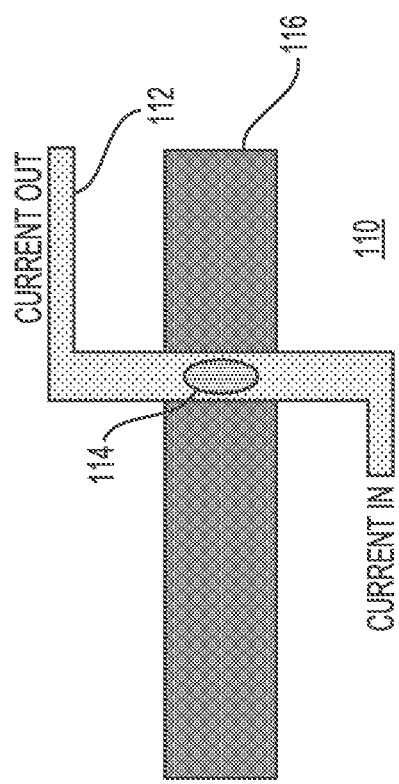
FIG. 1A
FIG. 1B

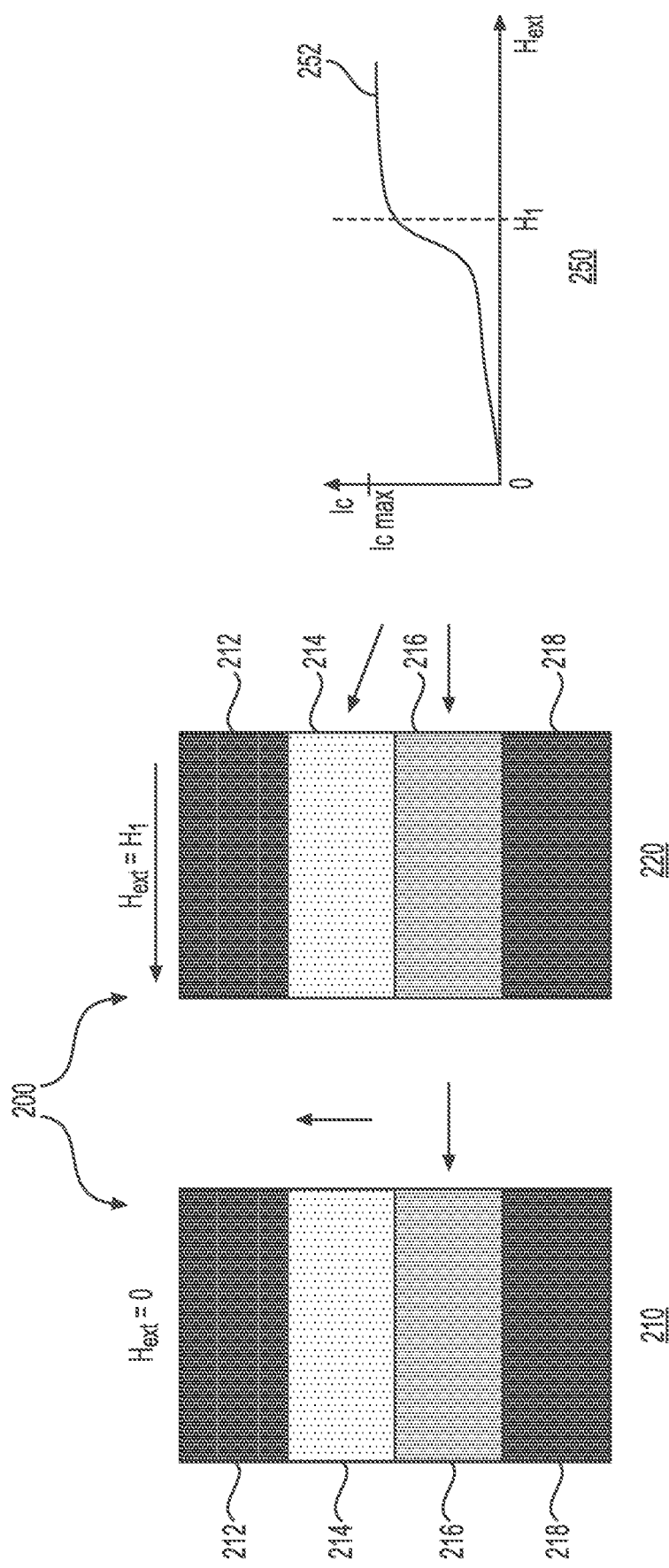

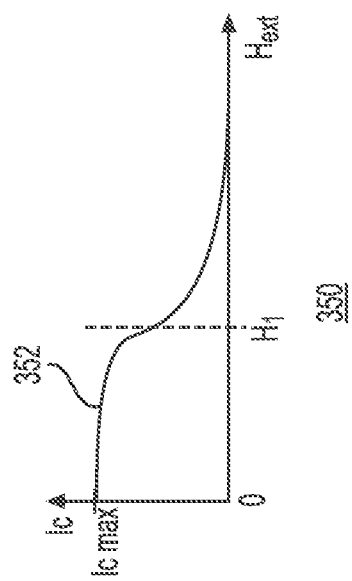
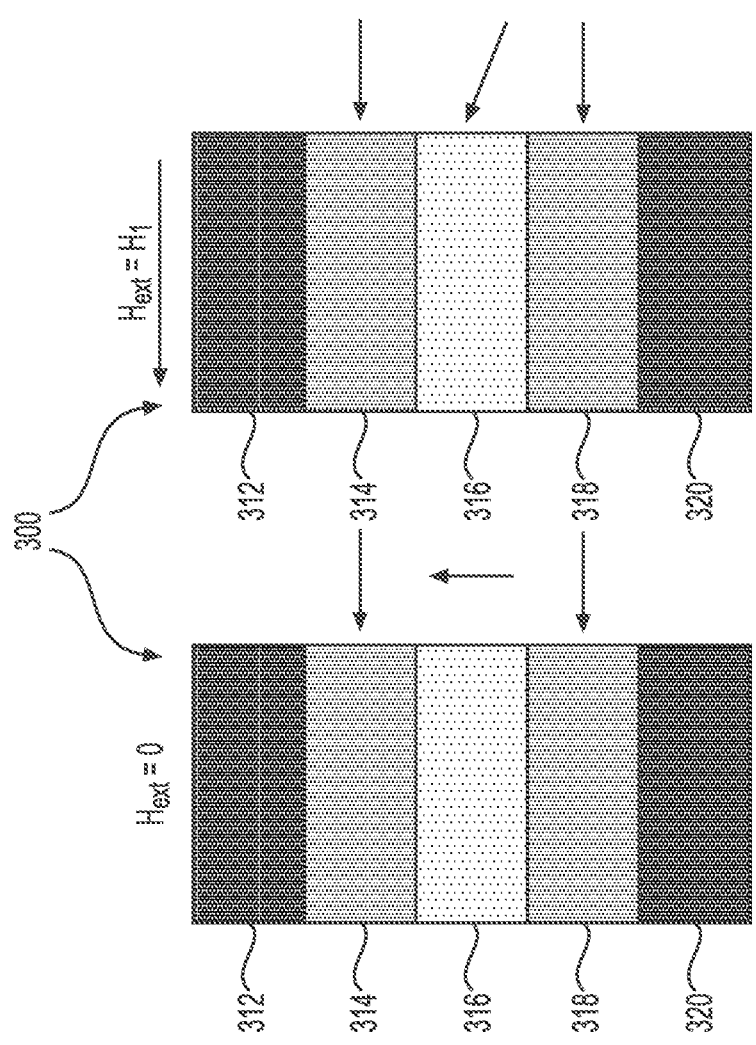

SUPERCONDUCTING SWITCH HAVING A PERSISTENT AND A NON-PERSISTENT STATE

BACKGROUND

Semiconductor based integrated circuits used in electronic devices include digital circuits based on complimentary metal-oxide semiconductor (CMOS) technology. CMOS technology, however, is reaching its limits in terms of the device size. In addition, leakage current in CMOS based circuits is causing high power consumption even when these circuits are not being accessed.

As an example, servers in a data center are increasingly consuming large amounts of power. The consumption of power is partly the result of power loss from the dissipation of energy even when the CMOS circuits are inactive. This is because even when such circuits inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing operations, such as read/write, a certain amount of power is wasted not only as a result of the requirement to maintain the state of the CMOS transistors, but also as a result of the current leakage.

An alternative approach to using CMOS technology based circuits is the use of superconducting logic based circuits.

SUMMARY

In one example, the present disclosure relates to a superconducting switch comprising a first superconducting layer and a second superconducting layer. The superconducting switch may further include a first magnetic layer having a fixed magnetization state. The superconducting switch may further include a second magnetic layer capable of being at least in a first magnetization state or a second magnetization state different from the first magnetization state. The superconducting switch may be capable of being in a first state or a second state, where the second state corresponds to an opposite state of the first state, and where the superconducting switch is configured such that an application of a magnetic field to the second magnetic layer changes a magnetization of the second magnetic layer from the first magnetization state to the second magnetization state placing the superconducting switch in the second state and a removal of the magnetic field automatically returns the superconducting switch from the second state to the first state.

In another aspect, the present disclosure relates to a superconducting switch comprising a first superconducting layer and a second superconducting layer. The superconducting switch may further include a first magnetic layer having a fixed magnetization state. The superconducting switch may further include a second magnetic layer capable of being at least in a first magnetization state or a second magnetization state different from the first magnetization state. The superconducting switch may further include a third magnetic layer having a second fixed magnetization state. The superconducting switch may further include a conductor inductively coupled to the second magnetic layer such that a flow of a current through the conductor results in an application of a magnetic field to the second magnetic layer. The superconducting switch may be capable of being in a first state or a second state, and where the second state corresponds to an opposite state of the first state, and where the superconducting switch is configured such that the application of the magnetic field changes a magnetization of the second magnetic layer from the first magnetization state to the second magnetization state placing the superconducting switch in the second state and a removal of the magnetic field automatically returns the switch from the second state to the first state.

In yet another aspect, the present disclosure relates to a memory system comprising a row of memory cells coupled to at least one write word-line and a write word-line driver coupled to the at least one write word-line. The write word-line driver may comprise a superconducting switch. The superconducting switch may include a magnetic layer configured to be in a first magnetization state or a second magnetization state, where the first superconducting switch is capable of being in a first state or a second state, and where the second state corresponds to an opposite state of the first state, and where the first superconducting switch is configured such that an application of a magnetic field to the magnetic layer changes a magnetization of the magnetic layer from the first magnetization state to the second magnetization state placing the first superconducting switch in the second state and a removal of the magnetic field automatically returns the switch from the second state to the first state.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 1A is a top view of a schematic diagram of a superconducting switch and FIG. 1B is a side view of the schematic diagram of the superconducting switch in accordance with one example;

FIGS. 2A and 2B show a structure of an FS valve for use in a superconducting switch in accordance with one example;

FIG. 2C shows a change in a magnitude of a current flowing through the FS valve in response to a change in a magnitude of a magnetic field applied to the FS valve in accordance with one example;

FIGS. 3A and 3B show another structure of an FS valve in accordance with one example;

FIG. 3C shows a change in a magnitude of a current flowing through an FS valve in response to a change in a magnitude of a magnetic field applied to the FS valve in accordance with one example;

DETAILED DESCRIPTION

Figure 4:
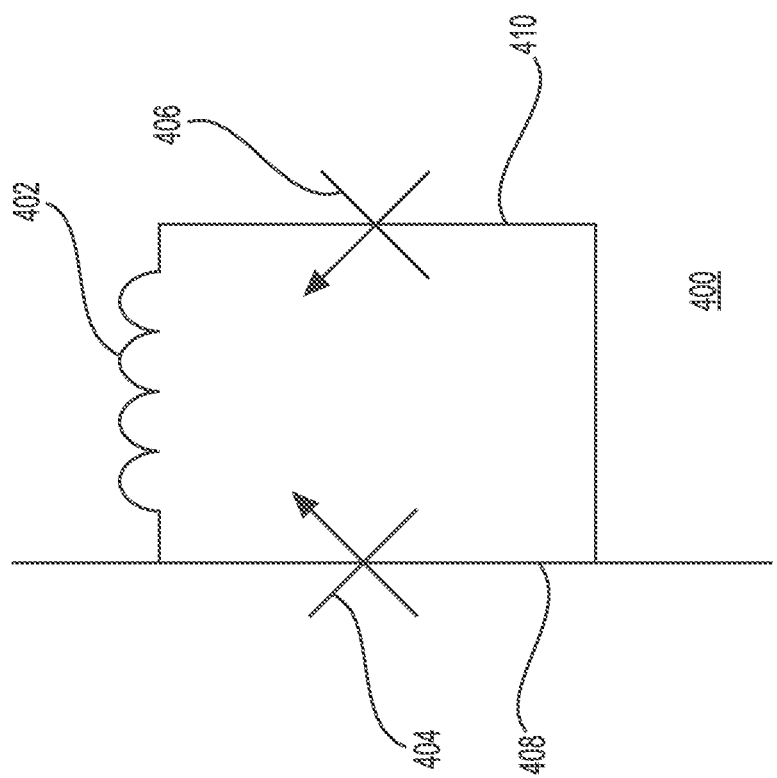
FIG. 4 shows a schematic diagram of a driver based on superconducting switch of FIG. 2 and superconducting switch of FIG. 3 in accordance with one example.

Examples described in this disclosure relate to superconducting logic based devices, including a superconducting switch, which may be a Magnetic Josephson Junction (MJJ) device. The superconducting switch may exist either in a resistive state or in a superconducting state. Only one of the two states may be persistent, while the other state may only be engaged while a magnetic field is applied to the superconducting switch. Certain examples further relate to using the superconducting switch as part of the drivers (e.g., write word-line drivers) for the Josephson Magnetic Random Access Memories (JMRAMs). Certain examples further relate to using reciprocal quantum logic (RQL) compatible superconducting switches and circuits. Unlike CMOS transistors, the RQL circuits are superconductor circuits that use Josephson junction based devices. An exemplary Josephson junction may include two superconductors coupled via a region that impedes supercurrent. The region that impedes supercurrent may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Superconductors, such as niobium, have a critical temperature (Tc) below which they have zero resistance. Niobium, one such superconductor, has a critical temperature (Tc) of 9.3 Kelvin degrees. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, the superconducting electrons are described by a quantum mechanical wave-function. A changing phase difference in time of the phase of the superconducting electron wave-function between the two superconductors corresponds to a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B (AanB) gate and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B, goes to output Q1 and the second input pulse goes to output Q2. The logical behavior of these gates may be based on the reciprocal data encoding mentioned earlier. As an example, a positive pulse changes the internal flux state of the inductive loop, but the trailing negative pulse erases the internal state every clock cycle, which in turn produces combinational logic behavior.

An example superconducting switch may allow supercurrent to flow in one state but restrict supercurrent in the second state. Only one of these two states may be stable, while the other can only be activated by the application of a magnetic field to the superconducting switch. The stable state may be determined by the arrangement of the ferromagnetic materials in the superconducting switch. Unlike other switches that may require one to both actively turn it on and actively turn it off, the example superconducting switches may automatically return to one of the states (on or off) when no magnetic field is being applied to the switch. This may advantageously lower the amount of power consumption by drivers or other circuits that may use such superconducting switches.

FIG. 1A is a top view 110 of a schematic diagram of a superconducting switch 100 and FIG. 1B is a side view 120 of the schematic diagram of superconducting switch 100 in accordance with one example. Superconducting switch may include a ferromagnetic superconducting value (FS valve) 114 that may be configured to allow (or not allow) supercurrent flow through a wire 112 coupled to FS valve 114. Another wire 116 may be inductively coupled to FS valve 114 such that a current flowing through wire 116 may be used to change a magnetization state of at least one layer of FS valve 114.

FIGS. 2A and 2B show a structure of an FS valve 200 and magnetization states of the magnetic layers in the FS valve for use in a superconducting switch in accordance with one example. In this example, FS valve 200 may include a superconducting layer 212, a free magnetic layer 214, a fixed magnetic layer 216, and another superconducting layer 218. In this example, free magnetic layer 214 possesses perpendicular magnetic anisotropy (PMA) such that the magnetization of free magnetic layer 214 points in a direction that is perpendicular to the plane of FS valve 200. In contrast, the magnetization of fixed magnetic layer 216 points in the same direction as the plane of FS valve 200. In this example and elsewhere in the present disclosure the term "free magnetic layer" means that the magnetic layer's magnetization is free to change, and the term "fixed magnetic layer" means that the magnetic layer's magnetization is fixed.

FIG. 2A shows FS valve 200 in a state 210 where no external magnetic field ($H_{ext}$) is being applied to free magnetic layer 214. In this state, the superconducting switch comprising FS valve 200 is in an off state. This is because in this state no supercurrent is flowing through FS valve 200. In terms of the underlying operation of FS valve 200, no supercurrent flows because while superconducting layers 212 and 218 are in a singlet superconductivity state, free magnetic layer 214 and fixed magnetic layer 216 are in a triplet superconductivity state. In the singlet superconductivity state, one of the bound pair of electrons may have an up spin while the other bound pair of electrons may have a down spin or vice-versa. In the triplet superconductivity state, the bound pair of electrons may have perfectly aligned spins, such that both of the electrons may have an up spin or a down spin. The pairs of electrons in the triplet superconductivity state are not supported by the layers that are in the singlet superconductivity state. This keeps FS valve 200 in a resistive state and no supercurrent flows through FS valve 200.

FIG. 2B shows FS valve 200 in a state 220 where an external magnetic field ($H_{ext}=H_1$) is being applied. As an example, the external magnetic field may be applied using wire 116 as explained with respect to FIG. 1. In this example, the application of the external magnetic field bends the magnetization of free magnetic layer 214 such that it aligns with the magnetization of fixed magnetic layer 216. The alignment of the magnetization of these layers enables a transient state that allows the electron pairs that are in the singlet superconductivity state to pass through the magnetic layers, including free magnetic layer 214 and fixed magnetic layer 216. FIG. 2C shows, via a graph 250, a change in a magnitude of a supercurrent (Ic) 252 flowing through FS valve 200 in response to a change in the magnitude of an external magnetic field ($H_{ext}$) applied to free magnetic layer 214 of FS valve 200.

With continued reference to FIGS. 2A and 2B, superconducting layers 212 and 218 may be formed using niobium. Free magnetic layer 214 may be formed using a multilayer stack comprising nickel and cobalt or cobalt and palladium. Alternatively, free magnetic layer 214 may be formed by growing iron and platinum on a chromium seed layer. Alloys may also be used to form free magnetic layer 214. As an example, free magnetic layer 214 may be an alloy comprising cobalt and palladium (e.g., $Co_{50}Pd_{50}$). Fixed magnetic layer 216 may be formed using a metal such as nickel. Alternatively, fixed magnetic layer 216 may be formed using an alloy, including an alloy comprising nickel and iron, an alloy comprising nickel, iron, and cobalt, or an alloy comprising nickel, iron, and chromium. Although FIGS. 2A and 2B show a certain number of layers arranged in a certain manner, FS value 200 may include additional layers. As an example, additional layers may include at least one insulating barrier (e.g., an aluminum oxide, aluminum nitride, or tantalum oxide barrier). The presence of the insulating barrier may enhance the resistance of FS valve 200. Without such an insulating barrier the FS valve may have only milli-ohms of resistance, while the addition of the insulating barrier could increase the resistance by as much as three orders of magnitude. This may enable more flexibility in impedance matching the FS valve to circuits that may have varying impedance requirements.

FIGS. 3A and 3B show another structure of an FS valve 300 in accordance with one example. In this example, FS valve 300 may include a superconducting layer 312, a fixed magnetic layer 314, a free magnetic layer 316, another fixed magnetic layer 318, and another superconducting layer 320. In this example, free magnetic layer 316 possesses perpendicular magnetic anisotropy (PMA) such that the magnetization of free magnetic layer 314 points in a direction that is perpendicular to the plane of FS valve 300. In contrast, the magnetization of fixed magnetic layer 314 and the magnetization of fixed magnetic layer 318 points in the same direction as the plane of FS valve 300. FIG. 3A shows FS valve 300 in a state 310 where no external magnetic field ($H_{ext}$) is being applied to free magnetic layer 316. In this state, the superconducting switch comprising FS valve 300 is in an on state. This is because even when no external magnetic field (e.g., $H_{ext}$) is being applied to FS valve 300, supercurrent is flowing through FS valve 300. In terms of the underlying operation of FS valve 300, supercurrent flows because while superconducting layers 312 and 320 are in a singlet superconductivity state, and free magnetic layer 316 is in a triplet superconductivity state, fixed magnetic layer 314 converts the current from the singlet superconductivity type to the triplet superconductivity type and fixed magnetic layer 318 converts the current back from the triplet superconductivity type to the single superconductivity type. This keeps FS valve 300 in an "on" state and supercurrent flows through FS valve 300.

FIG. 3B shows FS valve 300 in a state 330 where an external magnetic field ($H_{ext}=H_1$) is being applied. As an example, the external magnetic field may be applied using wire 116 as explained with respect to FIG. 1. In this example, the application of the external magnetic field bends the magnetization of free magnetic layer 316 such that it aligns with the magnetization of fixed magnetic layer 314 and fixed magnetic layer 318. The alignment of the magnetization of these layers enables a transient state that prevents the electron pairs that are in the singlet superconductivity state to pass through the magnetic layers, including fixed magnetic layer 314, free magnetic layer 316, and fixed magnetic layer 318. FIG. 3C shows, via a graph 350, a change in a magnitude of a supercurrent ($I_c$) 352 flowing through FS valve 300 in response to a change in the magnitude of an external magnetic field ($H_{ext}$) applied to free magnetic layer 316 of FS valve 300.

With continued reference to FIGS. 3A and 3B, superconducting layers 312 and 320 may be formed using niobium. Free magnetic layer 316 may be formed using a multilayer stack comprising nickel and cobalt or cobalt and palladium. Alternatively, free magnetic layer 316 may be formed by growing iron and platinum on a chromium seed layer. Alloys may also be used to form free magnetic layer 316. As an example, free magnetic layer 316 may be an alloy comprising cobalt and palladium (e.g., $Co_{50}Pd_{50}$). Each of fixed magnetic layers 314 and 318 may be formed using a metal such as nickel. Alternatively, each of fixed magnetic layers 314 and 318 may be formed using an alloy, including an alloy comprising nickel and iron, an alloy comprising nickel, iron, and cobalt, or an alloy comprising nickel, iron, and chromium. Although FIGS. 3A and 3B show a certain number of layers arranged in a certain manner, FS valve 300 may include additional layers. As an example, additional layers may include at least one insulating barrier (e.g., an aluminum oxide, aluminum nitride, or tantalum oxide barrier). The insulating barrier may enhance the resistance of FS valve 300. Without such an insulating barrier the FS valve may have only milli-ohms of resistance, while the addition of the insulating barrier could increase the resistance by as much as three orders of magnitude. This may enable more flexibility in impedance matching the FS valve to circuits that may have varying impedance requirements.

FIG. 4 shows a schematic diagram of a driver 400 based on superconducting switch 200 of FIG. 2 and superconducting switch 300 of FIG. 3 in accordance with one example. In this example, driver 400 may be used to drive superconducting circuits, including RQL-logic based superconducting circuits. Driver 400 may include two limbs 408 and 410; one of the limbs (e.g., limb 408) may include superconducting switch 404, which may be implemented as superconducting switch 300 of FIG. 3. The other limb (e.g., limb 410) of driver 400 may include superconducting switch 406, which may be implemented as superconducting switch 200 of FIG. 2. As shown in FIG. 4, the top portion of the limbs may be coupled via an inductor 402 and the bottom portions may be directly connected. In this example, superconducting switches 404 and 406 may replace a pair of superconducting quantum interference devices (SQUIDs), where the SQUIDs may be arranged in parallel limbs. In such conventional drivers, the two SQUIDs need to be alternately triggered to push current through the two limbs of the driver circuit. This has a 10% current cost due to current trapping in each SQUID; thus, the conventional drivers may only be 90% efficient. In this example, by utilizing these complementary superconducting switches, it is possible to build a more efficient driver. Superconducting switch 404 (implemented as superconducting switch 300) would function as part of the direct channel limb of the driver, while superconducting switch 406 (implemented as superconducting switch 200) would act on the other limb. Then, with a single activation line, both devices could be triggered allowing one to direct the current into each limb as required. In addition, conventional divers with SQUIDs require flux storage and flux dissipation. Advantageously, driver 400 may address this issue because at least one of the superconducting switches of driver 400 has a persistent resistive state (or an off state). In this example, the resistance of the superconducting switch that has a persistent resistive state may be used to dissipate any circulating currents.

Figure 5:
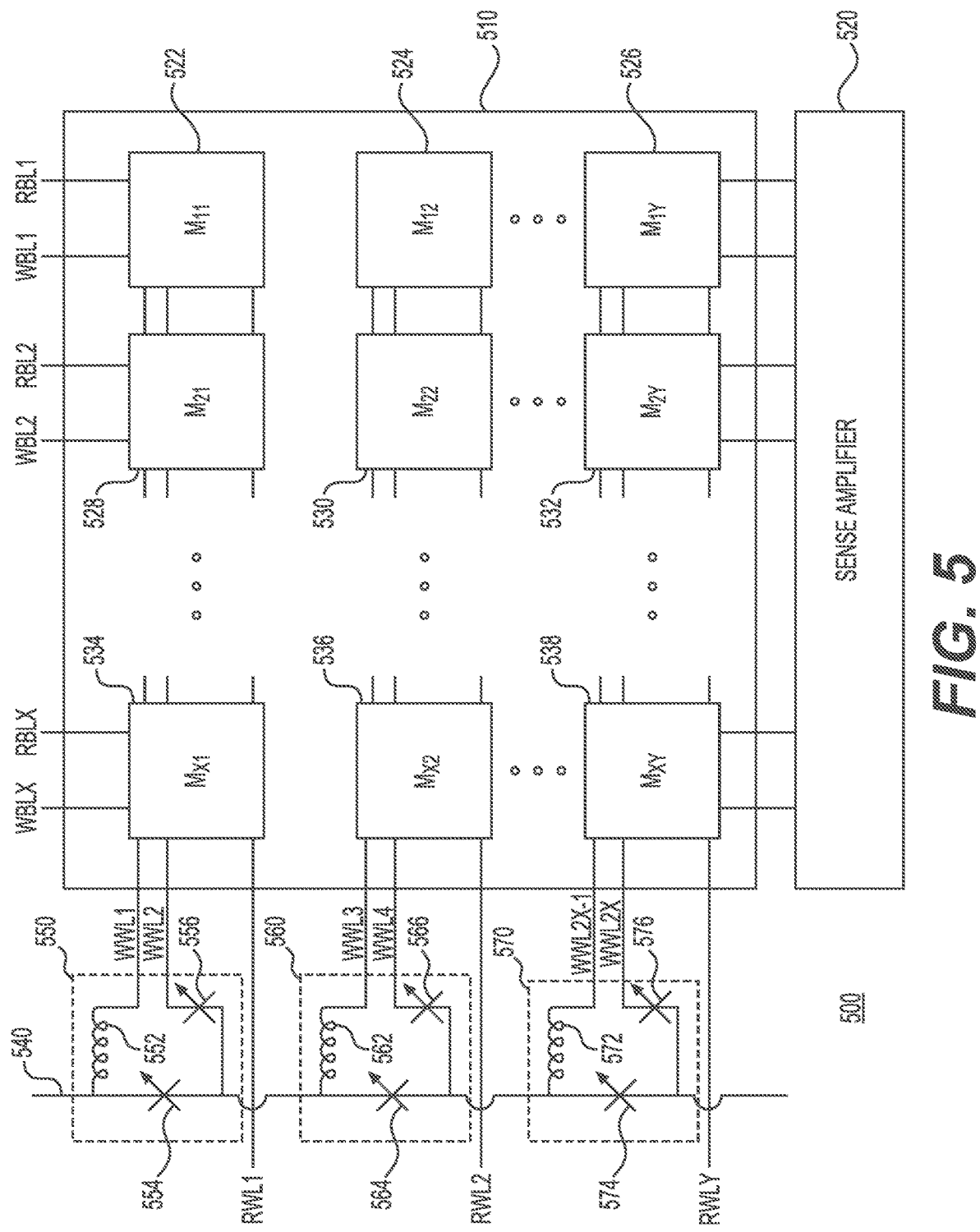
FIG. 5 shows a memory system including write word line drivers using the superconducting switch in accordance with one example.

FIG. 5 shows a portion of a memory system 500 including write word line drivers using the superconducting switches in accordance with one example. Memory system 500 may include memory cells organized in an array 510 of memory cells. Array 510 of memory cells may include X columns and Y rows (e.g., each of X and Y is an integer greater than at least 16). As an example, the right most column may include memory cells $M_{11}$ 522, $M_{12}$ 524, and $M_{1Y}$ 526. The column to the left of the right most column may include memory cells $M_{21}$ 528, $M_{22}$ 530, and $M_{2Y}$ 532. The left most column may include memory cells $M_{X1}$ 534, $M_{X2}$ 536, and $M_{XY}$ 538. The top row may include memory cells $M_{X1}$ 534, $M_{21}$ 528, and $M_{11}$ 522. The second row from the top may include memory cells $M_{X2}$ 536, $M_{22}$ 530, and $M_{12}$ 524. The bottom most row may include memory cells $M_{XY}$ 538, $M_{2Y}$ 532, and $M_{1Y}$ 526. An example memory cell may include a first magnetic Josephson junction (MJJ) device in parallel with a second MJJ device. The combination of these two may be configured such that under the application of appropriate amounts of current bias and magnetic flux, the memory cell may be in a logic '1' state or in a logic '0' state. In one example, if the memory cell is in the logic '1' state, under the application of a current via a word-line, the MJJ may transition into a "voltage state." A sense amplifier 520 coupled to the memory cell may sense the voltage as being representative of the logic '1' state. The logic '0' state may correspond to a "substantially zero-voltage state," such that in the logic '0' state, despite the application of a current via a word-line, the MJJ may stay in the "substantially zero-voltage state." The sense amplifier may sense this as being representative of the logic '0' state. In general, microwave signals (e.g., SFQ pulses) may be used to control the state of a memory cell. During read/write operations, word-lines and bit-lines may be selectively activated by SFQ pulses arriving via an address bus. These pulses may, in turn, control word-line and bit-line drivers that may provide word-line and bit-line currents to the relevant memory cells.

With continued reference to FIG. 5, in this example, each memory cell may be coupled to a read word-line (e.g., RWL1 for the memory cells in the top row) for performing a read operation. Each memory cell may also be coupled to a read bit-line (e.g., RBL1, RBL2, and RBLX) and a write bit-line (e.g., WBL1, WBL2, and WBLX). Each memory cell may also be coupled to a write word-line (e.g., WWL1 and WWL2 may be coupled to the memory cells in the top row, WWL3 and WWL4 may be coupled to the memory cells in the next row, and WWL2X-1 and WWL2X may be coupled to the memory cells in the bottom most row). Memory system 500 may further include drivers 550, 560, and 570 coupled to common line 540. Each of these drivers may be implemented in a similar fashion as driver 400 of FIG. 4. Driver 550 may include an inductor 552 coupled to write word-line WWL1. Driver 550 may further include superconducting switch 554 in one of the limbs and superconducting switch 556 in the other limb. As described earlier, superconducting switch 554 (implemented as superconducting switch 300) would function as part of the direct channel limb of driver 550, while superconducting switch 556 (implemented as superconducting switch 200) would act on the other limb. Then, with a single activation line, both switches could be triggered allowing one to direct the current into each limb as part of driving the write word-lines WWL1 and WWL2. Driver 560 may include an inductor 562 coupled to write word-line WWL3. Driver 560 may further include superconducting switch 564 in one of the limbs and superconducting switch 566 in the other limb. As described earlier, superconducting switch 564 (implemented as superconducting switch 300) would function as part of the direct channel limb of driver 560, while superconducting switch 566 (implemented as superconducting switch 200) would act on the other limb. Then, with a single activation line, both switches could be triggered allowing one to direct the current into each limb as part of driving the write word-lines WWL3 and WWL4. Driver 570 may include an inductor 572 coupled to write word-line WWL2X-1. Driver 570 may further include superconducting switch 574 in one of the limbs and superconducting switch 576 in the other limb. As described earlier, superconducting switch 574 (implemented as superconducting switch 300) would function as part of the direct channel limb of driver 570, while superconducting switch 576 (implemented as superconducting switch 200) would act on the other limb. Then, with a single activation line, both switches could be triggered allowing one to direct the current into each limb as part of driving the write word-lines WWL2X-1 and WWL2X.

Although FIG. 5 shows a certain number of components of a memory system 500 arranged in a certain manner, there could be more or fewer number of components arranged differently. As an example, although FIG. 5 shows one driver for every one of the write word-lines, a driver may be shared by a larger group of write word-lines.

Figure 6:
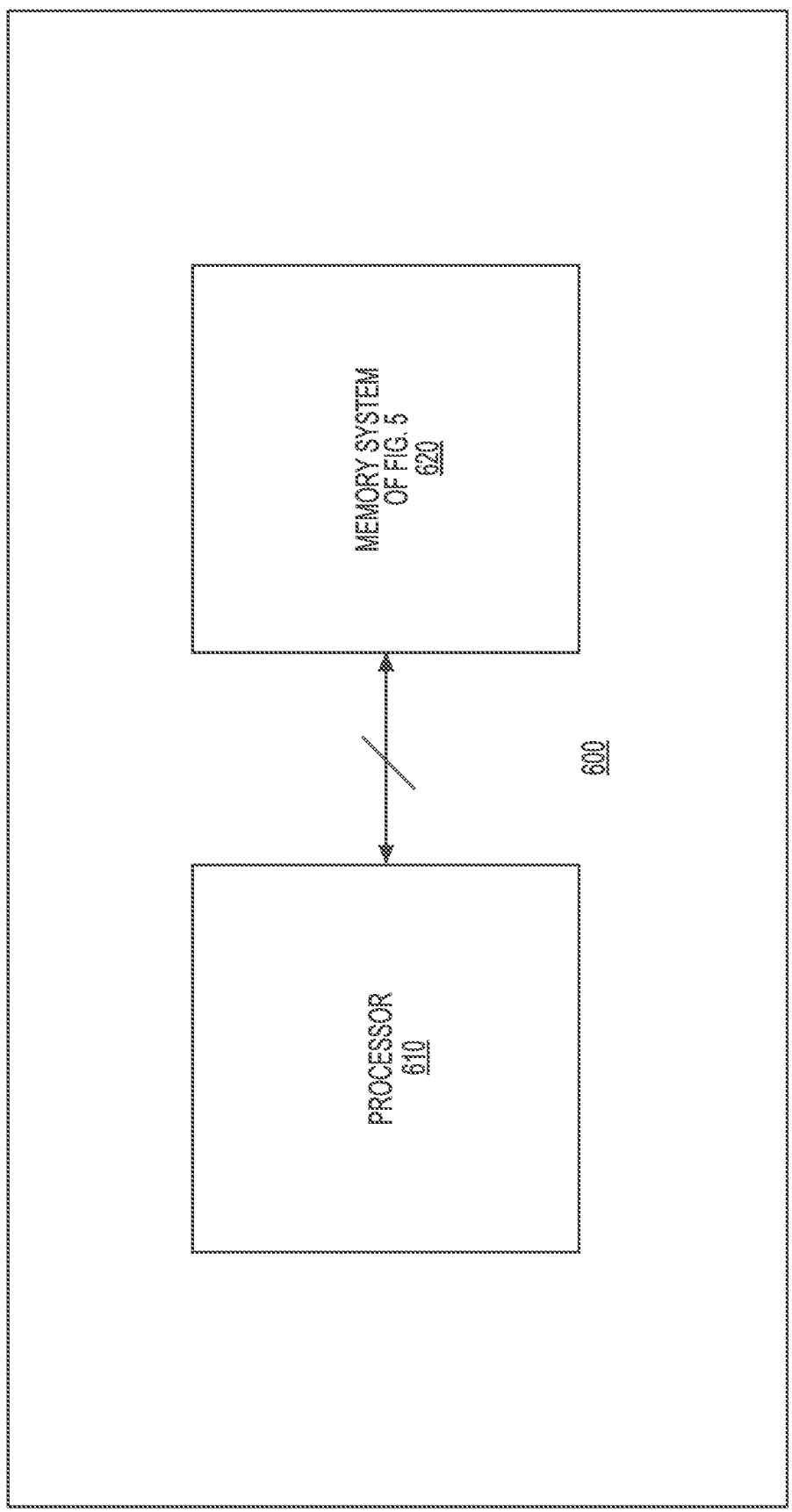
FIG. 6 shows a schematic diagram of a computing system including a processor coupled to a memory in accordance with one example.

FIG. 6 shows a computing system 600 including a processor 610 coupled to a memory 620 (e.g., memory system 500 of FIG. 5) in accordance with one example. Processor 610 may perform read or write operations on memory 620 in a manner as explained earlier. Additionally, processor 610 and memory 620 may be used along with other superconducting logic based devices. In general, any superconducting device operating in cryogenic environments and requiring storage of instructions or data may include memory 620. Furthermore, processor 610 need not be in a cryogenic environment; instead, it may operate at non-cryogenic temperatures. In this example, memory 620 may be in a separate cryogenic environment and may be coupled via connectors to processor 610 in a way that the cryogenic environment can be maintained. Memory 620 may be used as part of storage in a data center for delivering cloud-based services, such as software as a service, platform as a service, or other services.

In conclusion, the present disclosure relates to a superconducting switch comprising a first superconducting layer and a second superconducting layer. The superconducting switch may further include a first magnetic layer having a fixed magnetization state. The superconducting switch may further include a second magnetic layer capable of being at least in a first magnetization state or a second magnetization state different from the first magnetization state. The superconducting switch may be capable of being in a first state or a second state, where the second state corresponds to an opposite state of the first state, and where the superconducting switch is configured such that an application of a magnetic field to the second magnetic layer changes a magnetization of the second magnetic layer from the first magnetization state to the second magnetization state placing the superconducting switch in the second state and a removal of the magnetic field automatically returns the superconducting switch from the second state to the first state.

The first state may correspond to persistent state of the superconducting switch, and the second state may correspond to a non-persistent state of the superconducting switch. The superconducting switch may be configured to be in the second state only when the magnetic field is applied to the second magnetic layer. The first state of the second superconducting switch may correspond to an off state such that no supercurrent may flow between the first superconducting layer and the second superconducting layer in the off state and the second state of the superconducting switch may correspond to an on state such that a supercurrent may flow between the first superconducting layer and the second superconducting layer in the on state. The superconducting switch may further include an insulating layer.

Each of the first fixed magnetization state and the second fixed magnetization state may correspond to a magnetization in a first direction that is parallel to a plane, and where in the first state of the superconducting switch the first magnetization state of the second magnetic layer may correspond to a magnetization in a perpendicular direction to the first direction, and where in the second state of the superconducting switch the first magnetization state of the second magnetic layer may correspond to a magnetization in a second direction substantially parallel to the first direction. Each of the first superconducting layer and the second superconducting layer may comprise at least niobium, and each of the first magnetic layer and the second magnetic layer may comprise at least one of nickel, iron, or cobalt.

In another aspect, the present disclosure relates to a superconducting switch comprising a first superconducting layer and a second superconducting layer. The superconducting switch may further include a first magnetic layer having a fixed magnetization state. The superconducting switch may further include a second magnetic layer capable of being at least in a first magnetization state or a second magnetization state different from the first magnetization state. The superconducting switch may further include a third magnetic layer having a second fixed magnetization state. The superconducting switch may further include a conductor inductively coupled to the second magnetic layer such that a flow of a current through the conductor results in an application of a magnetic field to the second magnetic layer. The superconducting switch may be capable of being in a first state or a second state, and where the second state corresponds to an opposite state of the first state, and where the superconducting switch is configured such that the application of the magnetic field changes a magnetization of the second magnetic layer from the first magnetization state to the second magnetization state placing the superconducting switch in the second state and a removal of the magnetic field automatically returns the switch from the second state to the first state.

The first state may correspond to persistent state of the superconducting switch, and the second state may correspond to a non-persistent state of the superconducting switch. The superconducting switch may be configured to be in the second state only when the magnetic field is applied to the second magnetic layer. The first state of the second superconducting switch may correspond to an on state such that a supercurrent may flow between the first superconducting layer and the second superconducting layer in the on state and the second state of the second superconducting switch may correspond to an off state such that no supercurrent may flow between the first superconducting layer and the second superconducting layer in the off state. The superconducting switch may further include an insulating layer.

Each of the first fixed magnetization state and the second fixed magnetization state may correspond to a magnetization in a first direction that is parallel to a plane, and where in the first state of the superconducting switch the first magnetization state of the second magnetic layer may correspond to a magnetization in a perpendicular direction to the first direction, and where in the second state of the superconducting switch the first magnetization state of the second magnetic layer may correspond to a magnetization in a second direction substantially parallel to the first direction. Each of the first superconducting layer and the second superconducting layer may comprise niobium, and where each of the first magnetic layer, the second magnetic layer, and the third magnetic layer may comprise at least one of nickel, iron, or cobalt.

In yet another aspect, the present disclosure relates to a memory system comprising a row of memory cells coupled to at least one write word-line and a write word-line driver coupled to the at least one write word-line. The write word-line driver may comprise a superconducting switch. The superconducting switch may include a magnetic layer configured to be in a first magnetization state or a second magnetization state, where the first superconducting switch is capable of being in a first state or a second state, and where the second state corresponds to an opposite state of the first state, and where the first superconducting switch is configured such that an application of a magnetic field to the magnetic layer changes a magnetization of the magnetic layer from the first magnetization state to the second magnetization state placing the first superconducting switch in the second state and a removal of the magnetic field automatically returns the switch from the second state to the first state.

The write word-line driver further may comprise a first limb and a second limb coupled, where the second limb may be arranged in parallel to the first limb, and where the first superconducting switch may be arranged along the first limb. The write word-line driver may comprise a second superconducting switch, and where the second superconducting switch may be arranged along the second limb.

The second superconducting switch may comprise a second magnetic layer configured to be in a third magnetization state or a fourth magnetization state, where the second superconducting switch may be capable of being in a third state or a fourth state, and where the fourth state may correspond to an opposite state of the third state, and where the second superconducting switch is configured such that an application of a magnetic field to the second magnetic layer may change a magnetization of the second magnetic layer from the third magnetization state to the fourth magnetization state placing the second superconducting switch in the fourth state and a removal of the magnetic field may automatically return the switch from the fourth state to the third state.

The first state of the first superconducting switch may correspond to an off state such that no supercurrent may flow through the first superconducting switch in the off state, and where the second state of the first superconducting switch may correspond to an on state such that a supercurrent may flow through the first superconducting switch in the on state. The third state of the second superconducting switch may correspond to an on state such that a supercurrent may flow through the second superconducting switch in the on state, and where the fourth state of the second superconducting switch may correspond to an off state such that no supercurrent may flow through the second superconducting switch in the off state.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as processor 610, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A superconducting switch comprising:
a first superconducting layer;
a first magnetic layer having a fixed magnetization state;
a second magnetic layer capable of being at least in a first magnetization state or a second magnetization state different from the first magnetization state; and
a second superconducting layer, wherein the superconducting switch is capable of being in a first state or a second state, and wherein the second state corresponds to an opposite state of the first state, and wherein the superconducting switch is configured such that an application of a magnetic field to the second magnetic layer changes a magnetization of the second magnetic layer from the first magnetization state to the second magnetization state placing the superconducting switch in the second state and a removal of the magnetic field automatically returns the superconducting switch from the second state to the first state.

2. The superconducting switch of claim 1, wherein the first state corresponds to a persistent state of the superconducting switch, and wherein the second state corresponds to a non-persistent state of the superconducting switch.

3. The superconducting switch of claim 2, wherein the superconducting switch is configured to be in the second state only when the magnetic field is applied to the second magnetic layer.

4. The superconducting switch of claim 1, wherein the first state of the superconducting switch corresponds to an off state such that no supercurrent may flow between the first superconducting layer and the second superconducting layer in the off state and the second state of the superconducting switch corresponds to an on state such that a supercurrent may flow between the first superconducting layer and the second superconducting layer in the on state.

5. The superconducting switch of claim 1 further comprising an insulating layer.

6. The superconducting switch of claim 1, wherein the fixed magnetization state corresponds to a magnetization in a first direction that is parallel to a plane, and wherein in the first state of the superconducting switch the first magnetization state of the second magnetic layer corresponds to a magnetization in a perpendicular direction to the first direction, and wherein in the second state of the superconducting switch the second magnetization state of the second magnetic layer corresponds to a magnetization in a second direction substantially parallel to the first direction.

7. The superconducting switch of claim 1, wherein each of the first superconducting layer and the second superconducting layer comprises at least niobium, and wherein each of the first magnetic layer and the second magnetic layer comprises at least one of nickel, iron, or cobalt.

8. A superconducting switch comprising:
a first superconducting layer;
a first magnetic layer having a first fixed magnetization state;
a second magnetic layer capable of being at least in a first magnetization state or a second magnetization state different from the first magnetization state;
a third magnetic layer having a second fixed magnetization state;
a conductor inductively coupled to the second magnetic layer such that a flow of a current through the conductor results in an application of a magnetic field to the second magnetic layer; and
a second superconducting layer, wherein the superconducting switch is capable of being in a first state or a second state, and wherein the second state corresponds to an opposite state of the first state, and wherein the superconducting switch is configured such that the application of the magnetic field changes a magnetization of the second magnetic layer from the first magnetization state to the second magnetization state placing the superconducting switch in the second state and a removal of the magnetic field automatically returns the switch from the second state to the first state.

9. The superconducting switch of claim 8, wherein the first state corresponds to a persistent state of the superconducting switch, and wherein the second state corresponds to a non-persistent state of the superconducting switch.

10. The superconducting switch of claim 9, wherein the superconducting switch is configured to be in the second state only when the magnetic field is applied to the second magnetic layer.

11. The superconducting switch of claim 8, wherein the first state of the second superconducting switch corresponds to an on state such that a supercurrent may flow between the first superconducting layer and the second superconducting layer in the on state and the second state of the second superconducting switch corresponds to an off state such that no supercurrent may flow between the first superconducting layer and the second superconducting layer in the off state.

12. The superconducting switch of claim 8 further comprising an insulating layer.

13. The superconducting switch of claim 8, wherein each of the first fixed magnetization state and the second fixed magnetization state corresponds to a magnetization in a first direction that is parallel to a plane, and wherein in the first state of the superconducting switch the first magnetization state of the second magnetic layer corresponds to a magnetization in a perpendicular direction to the first direction, and wherein in the second state of the superconducting switch the first magnetization state of the second magnetic layer corresponds to a magnetization in a second direction substantially parallel to the first direction.

14. The superconducting switch of claim 8, wherein each of the first superconducting layer and the second superconducting layer comprises niobium, and wherein each of the first magnetic layer, the second magnetic layer, and the third magnetic layer comprises at least one of nickel, iron, or cobalt.

15. A memory system comprising:
a row of memory cells coupled to at least one write word-line; and
a write word-line driver coupled to the at least one write word-line, wherein the write word-line driver comprises:
a first superconducting switch comprising a magnetic layer configured to be in a first magnetization state or a second magnetization state, wherein the first superconducting switch is capable of being in a first state or a second state, and wherein the second state corresponds to an opposite state of the first state, and wherein the first superconducting switch is configured such that an application of a magnetic field to the magnetic layer changes a magnetization of the magnetic layer from the first magnetization state to the second magnetization state placing the first superconducting switch in the second state and a removal of the magnetic field automatically returns the switch from the second state to the first state.

16. The memory system of claim 15, wherein the write word-line driver further comprises a first limb and a second limb coupled, wherein the second limb is arranged in parallel to the first limb, and wherein the first superconducting switch is arranged along the first limb.

17. The memory system of claim 16, wherein the write word-line driver comprises a second superconducting switch, and wherein the second superconducting switch is arranged along the second limb.

18. The memory system of claim 17, wherein the second superconducting switch comprises a second magnetic layer configured to be in a third magnetization state or a fourth magnetization state, wherein the second superconducting switch is capable of being in a third state or a fourth state, and wherein the fourth state corresponds to an opposite state of the third state, and wherein the second superconducting switch is configured such that an application of a magnetic field to the second magnetic layer changes a magnetization of the second magnetic layer from the third magnetization state to the fourth magnetization state placing the second superconducting switch in the fourth state and a removal of the magnetic field automatically returns the switch from the fourth state to the third state.

19. The memory system of claim 18, wherein the first state of the first superconducting switch corresponds to an off state such that no supercurrent may flow through the first superconducting switch in the off state, and wherein the second state of the first superconducting switch corresponds to an on state such that a supercurrent may flow through the first superconducting switch in the on state.

20. The memory system of claim 19, wherein the third state of the second superconducting switch corresponds to an on state such that a supercurrent may flow through the second superconducting switch in the on state, and wherein the fourth state of the second superconducting switch corresponds to an off state such that no supercurrent may flow through the second superconducting switch in the off state.

* * * * *